United States Patent
Lacey, Jr.

(10) Patent No.: US 6,748,800 B2
(45) Date of Patent: Jun. 15, 2004

(54) WIND TUNNEL AND COLLECTOR CONFIGURATION THEREFOR

(75) Inventor: John J. Lacey, Jr., Minnetonka, MN (US)

(73) Assignee: Aero Systems Engineering, Inc., St. Paul, MN (US)

(*) Notice: Subject to any disclaimer, the term of this patent is extended or adjusted under 35 U.S.C. 154(b) by 0 days.

(21) Appl. No.: 10/229,898

(22) Filed: Aug. 28, 2002

(65) Prior Publication Data

US 2003/0070479 A1 Apr. 17, 2003

Related U.S. Application Data

(60) Provisional application No. 60/315,605, filed on Aug. 29, 2001.

(51) Int. Cl.⁷ .................................. G01M 9/00
(52) U.S. Cl. ....................................... 73/147
(58) Field of Search ........................... 73/147

(56) References Cited

U.S. PATENT DOCUMENTS 5,435,175 A * 7/1995 Kramer et al. ................ 73/147

OTHER PUBLICATIONS

K.K. Ahuja, "Aeroacoustic Performance of Open–Jet Wind Tunnels with Particular Reference to Jet/Collector Interactions" Georgia Institute of Technology, pp. 107–154; Oct. 1994.

* cited by examiner

Primary Examiner—Edward Lefkowitz
Assistant Examiner—Jermaine Jenkins
(74) Attorney, Agent, or Firm—Dorsey & Whitney LLP

(57) ABSTRACT

An open jet wind tunnel having a test section, a nozzle exit and a collector in which the leading edge of the collector is configured with at least a portion being non-uniformly spaced from the nozzle exit.

15 Claims, 7 Drawing Sheets

WIND TUNNEL AND COLLECTOR CONFIGURATION THEREFOR

This application claims the benefit of Provisional Application Serial No. 60/315,605 filed Aug. 29, 2001.

BACKGROUND OF THE INVENTION

1. Field of the Art

The present invention relates generally to a wind tunnel and to a collector design therefor, and more particularly to an open jet wind tunnel with a collector design to reduce resonance.

2. Description of the Prior Art

An existing and well-recognized problem with open jet wind tunnels is the pulsing or resonance which occurs at various frequencies. Open jet wind tunnels are used extensively in the automotive industry and various other industries for the purpose of determining aerodynamic forces on a test vehicle or other object. A typical configuration of an open jet wind tunnel includes a test section often comprising a large room or other closed configuration, a nozzle at the upstream end of the test section and a collector at the downstream end of the test section. Generated air flow flows along a flow path from the nozzle, across the test section and into the collector. During a test, the vehicle or other object to be tested is positioned in the test section within the air flow.

An observed problem with open jet wind tunnels which often restricts their use at certain air speeds includes a pulsing phenomenon or resonance which occurs at such air speeds. This pulsing or resonance, in some cases, may simply make the air flow and the floor pressures unsteady so as to adversely affect the air flow past the test object. In other cases, the pulsing or resonance may be strong enough to damage the building structure. Various authorities have recognized this problem in open jet wind tunnels and have speculated that such pulsing phenomenon or resonance is directly related to test section air speeds and wind tunnel dimensions and that the mechanism that excites such resonance involves the interaction of vortices of air flow from the nozzle to the collector. It has also been speculated that decreasing the length of the test section at a given air speed will have the tendency to reduce resonances at that sir speed However, this is a limitation on the capability of the system and is often not an option because of the test section length needed for a particular application. Accordingly, to the extent that this problem has been addressed, it has been primarily addressed by adjusting air speeds and/or wind tunnel and test section dimensions in an attempt to avoid the undesirable resonance problems. The result, however, is that this merely changes the frequency or air speed conditions at which the resonance or the pulsing phenomenon occurs or places other significant limitations upon the system.

Accordingly, there is a need in the art for a wind tunnel construction, and in particular an open jet wind tunnel, which not only minimizes, but preferably eliminates, resonance problems for desired air speed and the wind tunnel dimensions.

SUMMARY OF THE INVENTION

In contrast to the prior art, the present invention is directed to an open jet wind tunnel design, and more particularly to a collector design for use in such wind tunnel, which minimizes, if not eliminates, resonance problems such as those described above for particular applications.

Specifically, the present invention focuses on the belief that the resonance is created at various frequencies as a result of eddies or other air flow between the exit edge of the nozzle exit and the leading edge of the collector. In conventional collector design, these edges are all uniformly spaced from one another. Thus, they combine their energies to excite the undesirable resonance. Although speculation exists that creating paths of unequal length between the nozzle and the collector will reduce high amplitude resonances, this has never been tested. In accordance with the present invention, the collector is designed and configured so that the spacing between the exit nozzle and the leading edge of the collector varies (or is non-uniform) from point to point along the collector edge. Thus, there is insufficient energy at any one frequency to excite an undesirable resonance.

In accordance with a preferred embodiment of the present invention, one or more sections of the leading edge of the collector are sloped relative to the exit nozzle and relative to a vertical plane orthogonal to the flow path of the air. Thus, air flowing from the exit nozzle toward the collector strikes the leading edge of the collector at different times because of the non-uniform spacing and therefore limits or suppresses the generation of undesirable resonance. In a most preferred embodiment of the invention, the leading edge of the collector includes a top edge section which is uniformly spaced from the exit nozzle, and a pair of sloping side edge sections which slope downwardly and away from the top section and thus results in a leading edge in which the distance from such edge to the exit nozzle or the above mentioned plane is non-uniform.

Accordingly, it is an object of the present invention to provide an improved open jet wind tunnel.

Another object of the present invention is to provide an open jet wind tunnel with a configuration which, minimizes, if not eliminates, undesirable resonance.

A further object of the present invention is to provide an open jet wind tunnel with an improved collector design which minimizes, if not eliminates, undesirable resonance.

A still further object of the present invention is to provide a collector design for an open jet wind tunnel in which points along the leading edge of the collector are non-uniformly spaced from the nozzle.

These and other objects of the present invention will become apparent with reference to the drawings, the description of the preferred embodiment and the appended claims.

DESCRIPTION OF THE PREFERRED EMBODIMENT

Figure 1:
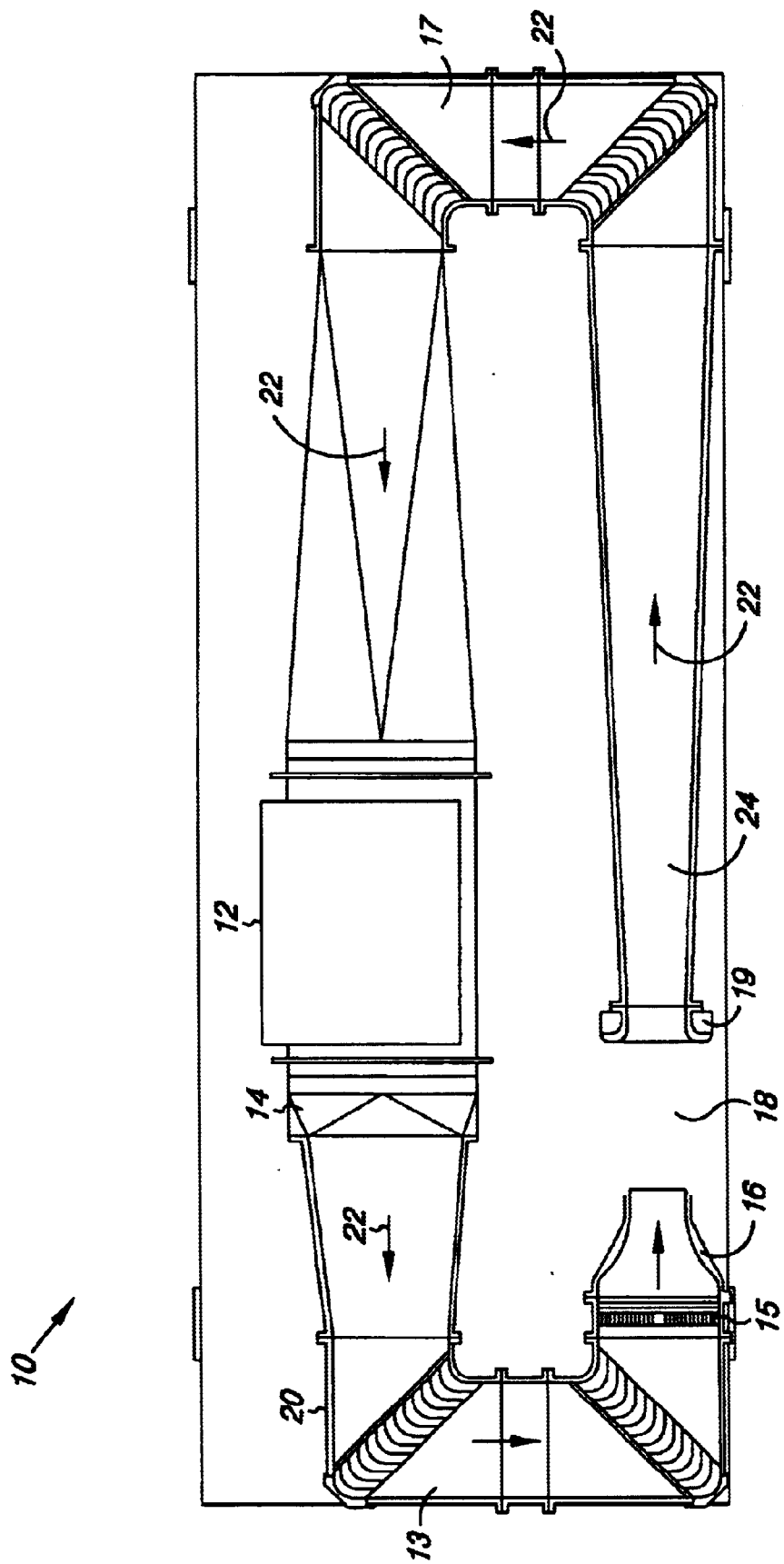
FIG. 1 is an isometric view of the wind tunnel in accordance with the present invention.

Reference is first made to FIG. 1 showing an isometric view of the wind tunnel and improved collector design in accordance with the present invention. The wind tunnel 10 includes a flow generator means which is commonly in the form of a fan 12, a heat exchanger or heat exchanger assembly 14, a plurality of turning vanes 13 and 17, one or more flow conditioning elements 15, a nozzle 16, a test section 18 and a collector 19. During operation, the fan 12 is driven by a motor drive to create a high velocity air flow stream 22 in the flow duct 20. The actual air velocity which is generated varies greatly depending on the intended use for the wind tunnel; however, typical values range from as low as 5 miles per hour or lower to several times the speed of sound. Although the wind tunnel of the present invention has a variety of applications, it has particular applicability to the automotive industry. When used in connection with the automotive industry, the air speed normally ranges from about 5 to 200 miles per hour.

The preferred embodiment utilizes a fan to accelerate the air because of its ability to move large volumes of air. However, those skilled in the art will realize that various alternate flow generating means can be used as well such as blowers, compressors, diffusers, nozzles, vacuum tanks, high pressure storage chambers and various combinations thereof.

The motor drive powers the flow generator or fan 12. Because much of the energy supplied by the motor drive and the fan 12 is converted into heat, a heat exchanger 14 is provided. The temperature of the air leaving the heat exchanger 14 will vary depending upon the intended application of the wind tunnel and the velocity of the air flow involved; however, a typical temperature for air exiting the heat exchanger 14 for automotive applications is in the range of −50 to +60° C. After leaving the heat exchanger, the air flow stream 22 travels through the turning vane 13 which changes the flow direction of the flow stream 180 degrees and into the flow conditioning elements 15. The flow conditioning elements 15 straighten the flow stream 22 to further reduce any turbulence. The preferred embodiment contemplates the use of a honey comb style flow straightener. However, depending upon the wind tunnel application, the flow conditioning elements could be eliminated or replaced by other devices.

Upon leaving the flow conditioning elements 15, the flow stream 22 is further accelerated through the nozzle 16 before exiting the nozzle and entering the test section 18. During use, the flow stream 22 passes over a test object in the test section 18 before being returned by the collector 19 to the flow duct 24, through the turning vane 17 and back to the flow generator 12.

In the preferred embodiment the wind tunnel is a closed circuit wind tunnel in which the wind (or air) is continuously circulated through the system along the air flow stream. It is understood, however, that many of the concepts and features of the present invention may be equally applicable to wind tunnels which are not of the closed circuit type. In actual construction and use, the test section 18 is defined by a test section room or containment which totally surrounds the test section 18 and is larger than the nozzle 16 and the collector 19.

Figure 2:
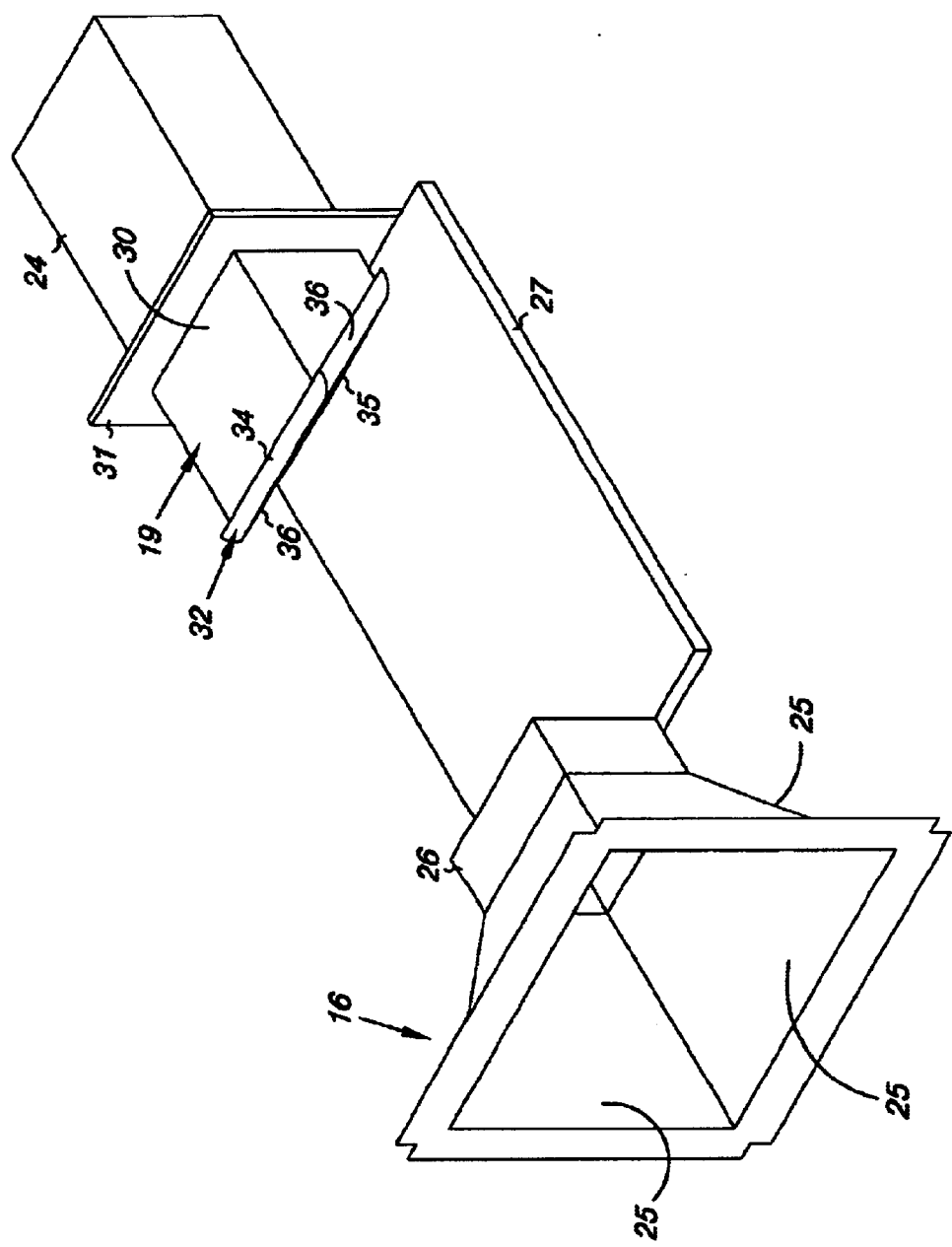
FIG. 2 is an isometric view of the test section components of the wind tunnel showing the nozzle, the test section and the collector.

Reference is next made to FIG. 2 illustrating the test section components of the wind tunnel which comprises the nozzle or tunnel assembly 16, the test section 18 and the collector 19.

Figure 5:
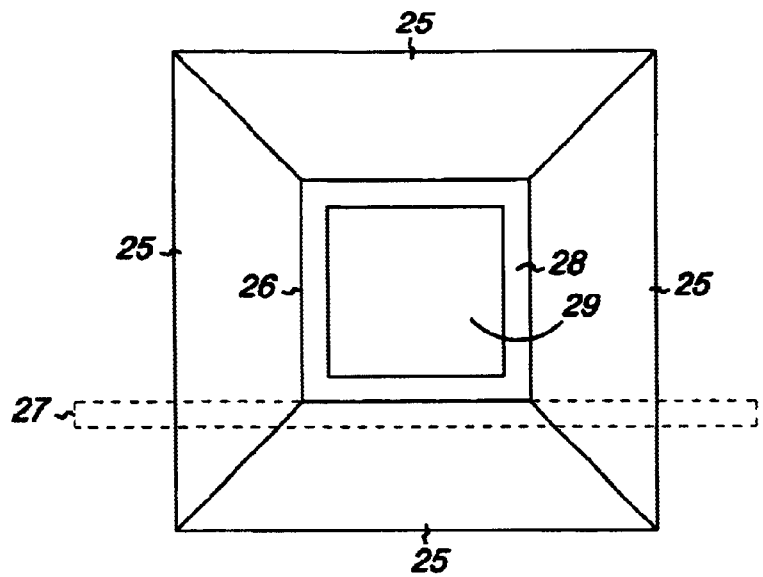
FIG. 5 is an elevational end view of the nozzle, as viewed in the upstream direction, in accordance with the present invention.

With reference to FIGS. 2, 3, 4 and 5, the nozzle or tunnel assembly 16 includes a plurality of sloping walls 25 which converge in the direction of the air flow 22 toward a nozzle exit member 26. The nozzle exit member 26 includes a side wall which extends generally parallel to the air flow for a short distance and terminates at an air flow exit end 28 (FIG. 5). The air flow exit end 28 defines the air flow exit opening 29 through which the air flow passes before being exposed to the test object 23. In the preferred embodiment, the exit end 28 lies in a plane generally perpendicular or orthogonal to the movement of the air flow 22 through the nozzle assembly 16. The nozzle 16 of the preferred embodiment includes four shaped and converging walls 25 to accelerate the air flow and four side walls defining the nozzle exit member 26. Thus, the cross sectional configuration of the nozzle assembly 16 cut along a plane generally orthogonal to the air flow is rectangular. Such cross sectional configuration, and thus the number and configuration of the walls 25 and 26, however, may be modified depending upon the characteristics of air flow desired and the specific application of the wind tunnel.

Figure 9:
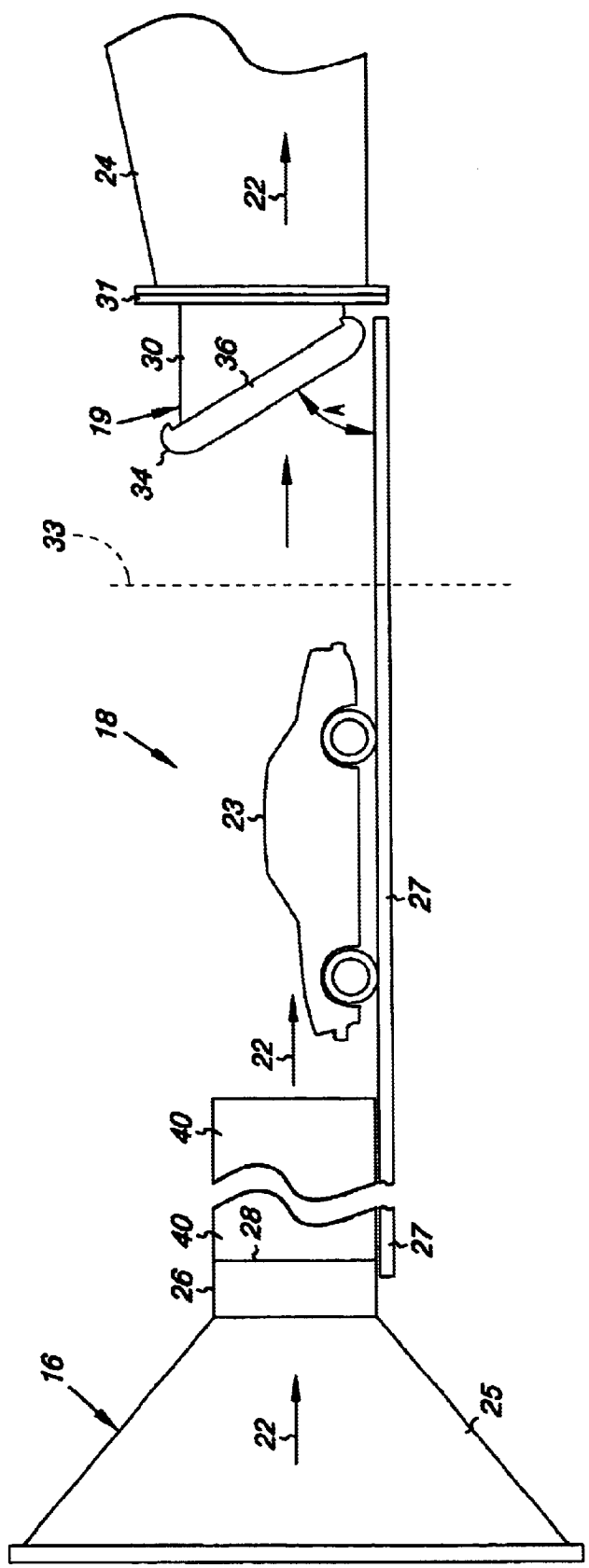
FIG. 9 is an elevational side view of the wind tunnel, similar to FIG. 3, but showing nozzle extenders.

If desired, nozzle extenders 40 as shown in FIG. 9 can be utilized to vary the length of the test section 18 so as to accommodate certain test vehicles or objects and to control resonances at certain air flow speeds as will be discussed in greater detail below. The nozzle extenders 40 are generally tubular elements having a preferred cross-sectional size and configuration substantially matching that of the nozzle outlet 28 and a length which provides the desired air flow characteristics (and elimination of resonances) at the desired air flow speed, test section length and collector configuration.

The test section 18 includes a base 27 which upon the test object 23 may be mounted and is positioned between the nozzle 16 (or the nozzle extender 40 of FIG. 9) and the collector 19. The test section includes an upstream end adjacent to the nozzle 16 and a downstream end adjacent to the collector 19. The test object 23 such as a vehicle or the like is positioned on, or mounted to, the base 27, in a conventional manner. During use, the air flow 22 flows from the nozzle 16 (or nozzle extender 40), across the test section 18 and to the collector 19 in the direction of the flow path 22.

The collector 19 is the structural element of the wind tunnel which is positioned adjacent the downstream end of the test section 18 and functions to return the air flow to the return duct 24. The collector 19 includes a collector housing 30 having a rearward flange or bracket 31 for connecting the collector 19 to the return flow duct 24. In the preferred embodiment, the housing 30 forms a generally tubular configuration with walls extending rearwardly from the leading edge of the collector 19 in a direction generally parallel to the air flow 22 in the test section 18. The collector 19 also includes a forwardly positioned leading edge 32 which faces upstream relative to the air flow and which thus engages the air flow after it passes the test object. As shown best in FIGS. 2 and 6, the leading edge of the collector includes a plurality of sections, namely, a top section 34, a bottom section 35 and a pair of side sections 36,36. The plurality of sections 34, 35, 36 and 36 define an air flow inlet opening 38. The opening 38 receives air passing the test object 23 in the test section 18 and returns it to the return duct 24 for recirculation.

Figure 3:
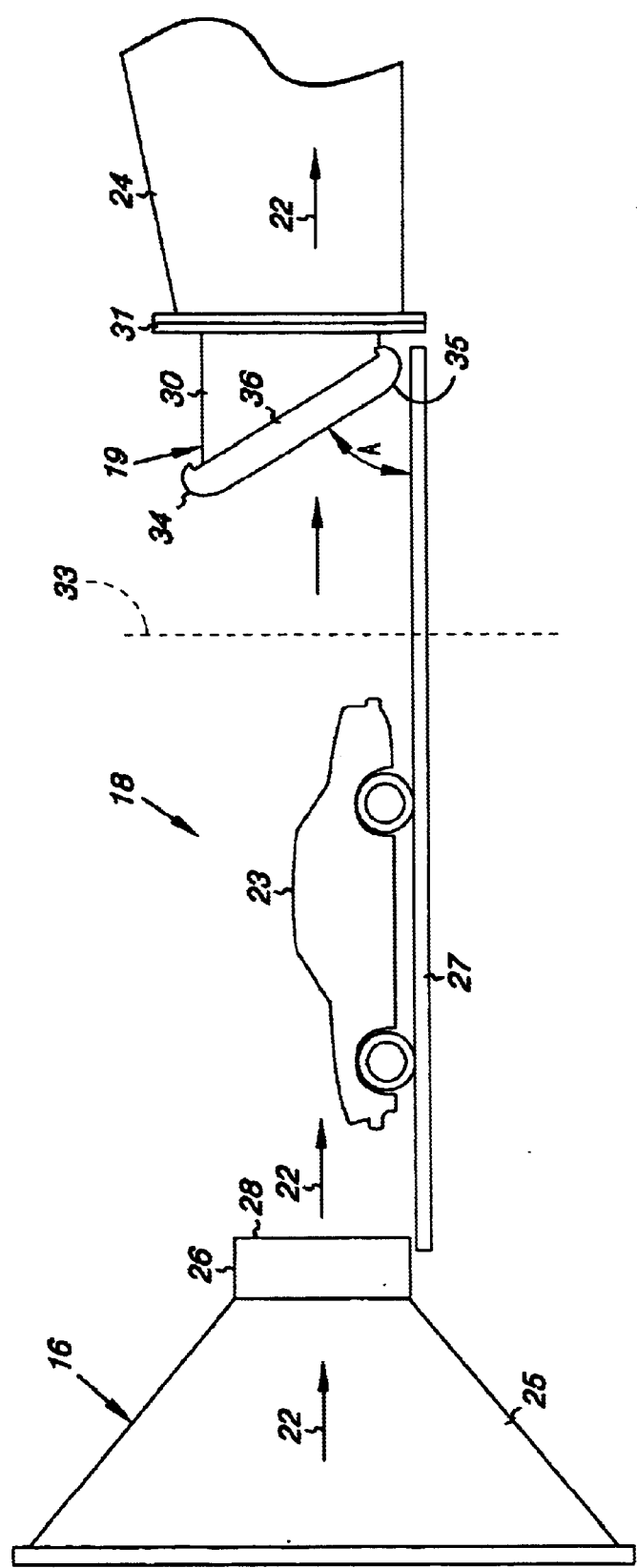
FIG. 3 is an elevational side view of the test section components of the wind tunnel.
Figure 4:
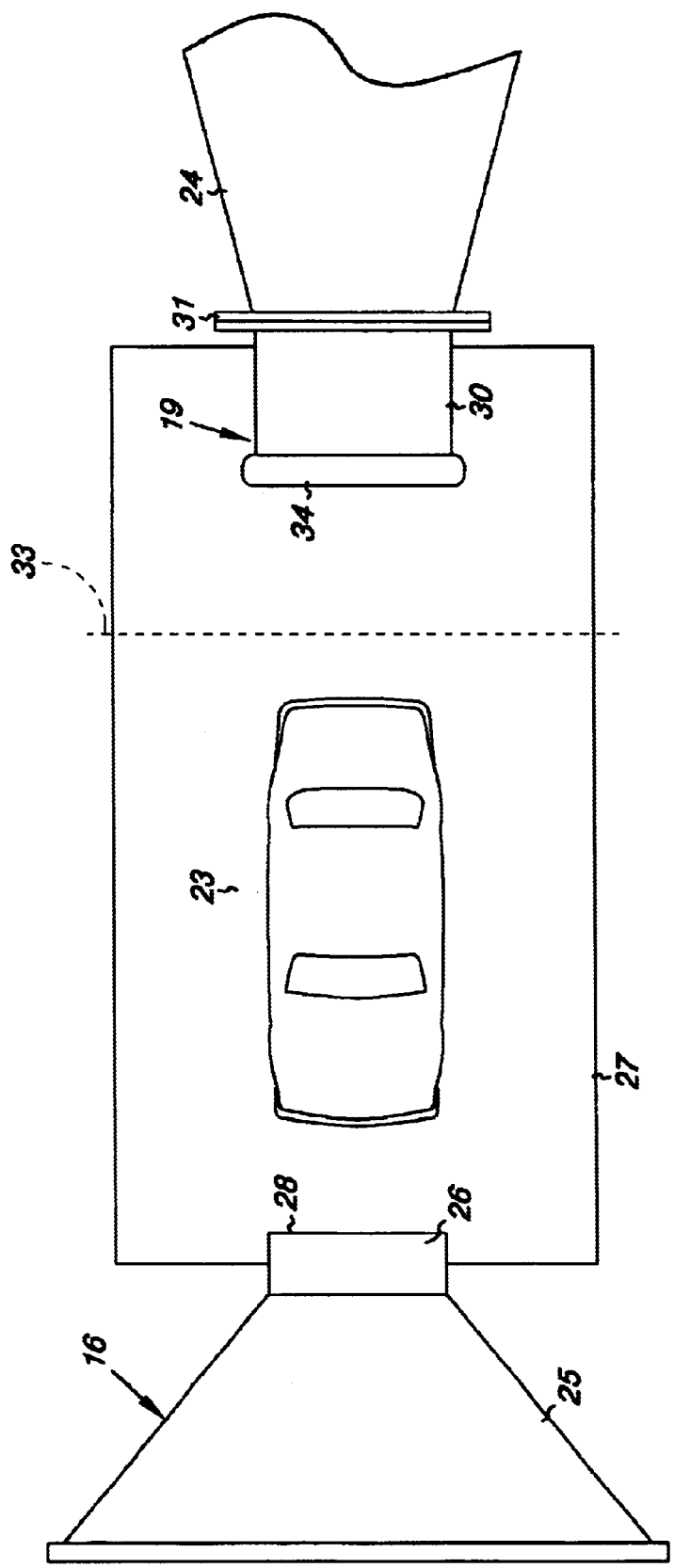
FIG. 4 is an elevational top view of the test section components of the wind tunnel.

As shown best in FIGS. 2 and 3, the leading edge 32 has a configuration in which the top section 34 and bottom section 35 are generally perpendicular to the direction of air flow 22. Thus, points along the section 34 are generally uniformly spaced from the nozzle exit end 28 and points along the section 35 are generally uniformly spaced from the nozzle exit end 28, but at a distance different from one another. In contrast, the side sections 36,36 each slope downwardly and rearwardly (away from the test section 18) at an angle "A" from the top section 34 in the direction of the air flow, Thus, points along the side sections, 36,36 are not uniformly spaced from the nozzle exit end 28.

Although applicant does not wish to be bound to any particular theory, it is believed that the undesirable resonance and pulsation in existing open jet wind tunnels is a result of eddies or other air flow between the exit edge of the nozzle exit and the leading edge of the collector 19. Because these edges in conventional and existing designs are all substantially uniformly spaced from one another, they combine their energies to excite the undesirable resonance. By modifying the test area structure, and in particular the configuration of the collector 19 and thus the leading edges of the collector 19, so that the distance between the nozzle exit and at least a portion of the leading edges of the collector are not uniformly spaced, there is insufficient energy at any one frequency to excite the resonance. Accordingly, the present invention is directed to providing a wind tunnel test area comprising the nozzle or nozzle exit 16, the test section 18 and the collector 19, in which the space or distance between the exit edge of the nozzle and points along the leading edge of the collector is non-uniform, or which at least includes sections where such space or distance is non-uniform. Thus, the present invention provides a test area including a nozzle with an exit edge and a collector with a leading edge in which the nozzle exit edge and/or the collector leading edge are configured to provide non-uniform spacing between points along the nozzle exit edge and corresponding points along the collector leading edge. Although it is possible for either the nozzle exit edge or the collector leading edge, or both, to be configured to provide this non-uniform spacing, in the preferred embodiment, the points along the nozzle exit edge lie in a common vertical plane. In contrast, the collector leading edge is configured so that points along at least a portion of such edge are non-uniformly spaced from such vertical plane.

Another way of expressing the structure of the present invention is to define the position of the leading edge 32 of the collector 19 relative to an imaginary plane orthogonal to the flow path 22 of the air stream in the test section 18. Such an imaginary plane is illustrated in FIG. 3 by the reference character 33. In the preferred collector structure, the leading edge sections 34 and 35 are generally parallel to such orthogonal plane 33 and thus points along the leading edge sections 34 and 35 are substantially uniformly spaced from the plane 33. However, because the leading edge sections 36,36 are sloped relative to the plane 33, points along the edge sections 36,36 are non-uniformly spaced from the orthogonal plane 33. Further, although points along the leading edge section 34 are uniformly spaced from the plane 33 and points along the leading edge section 35 are uniformly spaced from the plane 33, the distances between the points on the edge section 34 and the plane 33 and between the points on the edge section 35 and the plane 33 are different from one another. Thus, in the structure of the preferred embodiment, only a portion (no more than about 60 percent) of the leading edge of the collector 19 is uniformly spaced from the plane 33 or the nozzle exit. More preferably, no more than about 50 percent of the leading edge of the collector 19 should be at a uniform distance from the plane 33 or the nozzle exit, and most preferably, no more than about 40 percent of the leading edge of the collector 19 should be at a uniform distance from the plane 33 or the nozzle exit.

Figure 10:
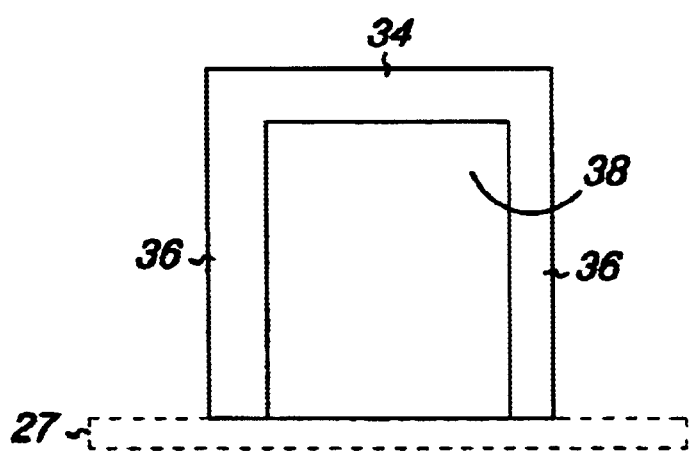
FIG. 10 is an elevational end view of a further embodiment of a collector design in which the bottom lead ledge has been eliminated.

It should be noted that an open jet wind tunnel can have four exposed or impact leading edge sections as shown or three exposed or impact leading edge sections as shown in FIGS. 9 and 10 in which the base 27 of the test section is substantially continuous with the bottom entrance to the collector 19 or any of a variety of different configurations having various numbers of exposed or impact leading edge sections. Regardless of the number of leading edge sections, the above percentages are intended to apply only to the exposed or impact edges.

For purposes of determining whether a leading edge section 34, 35, 36,36 of the collector 19, or points along a leading edge section are uniformly or non-uniformly spaced from the plane 33 or the nozzle exit, the point considered is the stagnation point or the point at a particular location or cross-section on the leading edge section which is closest to the plane 33 or the nozzle exit. The collection of these points generally follows the periphery of the collector opening 38. Thus, points along the leading edge section 34 would each be uniformly spaced from the plane 33 at a first distance, and points along the leading edge section 35 would be uniformly spaced from the plane 33 at a second distance, but points along the leading edge sections 36,36 would be non-uniformly spaced from the plane 33.

In the structure of the preferred embodiment shown best in FIG. 3, the angle "A" which the leading edge sections 36,36 form with the base 27 of the test section 18 (or the flow path 22) may be altered or adjusted to provide optimum and desired results. Specifically, the edge sections 36,36 slope at an angle other than 90 degrees. Although no particular angle "A" is necessary to accomplish the objectives of the present invention so long as a portion of the leading edge of the collector is non uniformly spaced from the nozzle exit or the orthogonal plane 33, the angle "A" which the leading edge sections 36,36 form with the flow path 22 should preferably be from about 30° to 85°, more preferably from about 40° to 80° and most preferably from about 50° to 75°. Further, although the preferred embodiment shows the side edge sections 36,36 sloping downwardly and rearwardly (away from the test section 18), they could also slope downwardly and forwardly.

Figure 7:
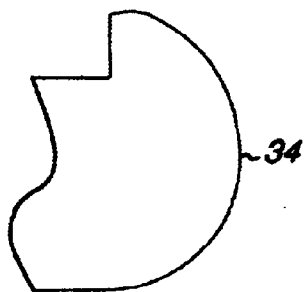
FIG. 7 is a view, partially in section, as viewed along the section line 6—6 of FIG. 5.
Figure 8:
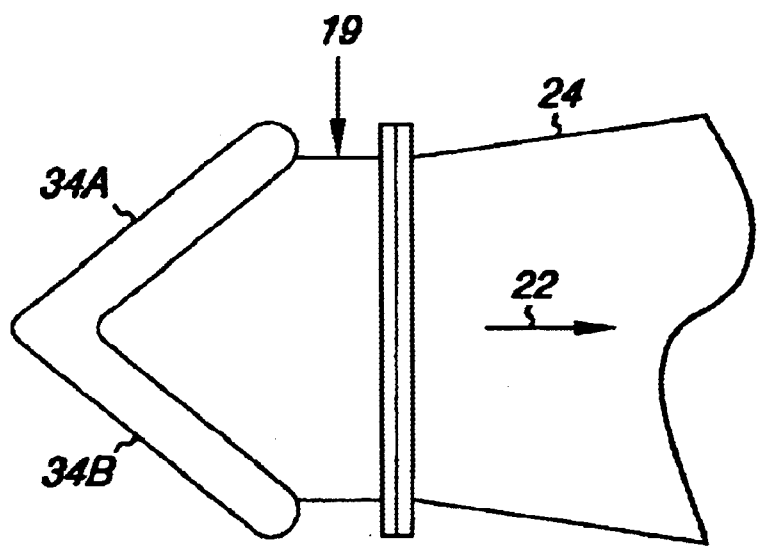
FIG. 8 is an elevational top view of an alternate embodiment of a collector design.

It is also contemplated that various leading edge configurations, other than the angled side edge configuration shown in FIGS. 2 and 3, may be provided to accomplish the objectives of the present invention. For example, one or more of the edge sections 34, 35, 36,36 could be curved or provided with any other configuration in which points along those edge sections are spaced at varying, non-uniform distances from the nozzle exit or orthogonal plane 33. FIG. 7 shows a possible alternate embodiment in which the top leading edge section is formed by two portions 34A and 34B. As shown, the edge portions 34A and 34B are sloped at an angle relative to the flow path 22 of the air flow. This top leading edge configuration can be combined with vertical, sloping or curved side edges as well as a horizontal, angled or curved bottom edge.

Figure 6:
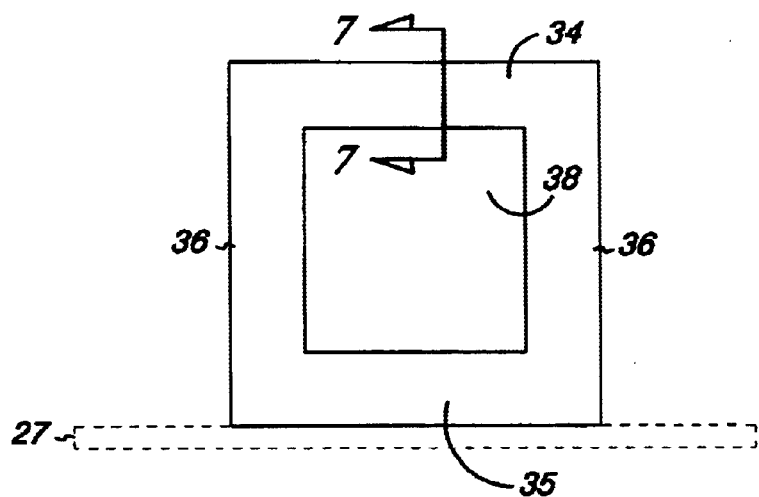
FIG. 6 is an elevational end view of the collector, as viewed in the downstream direction, in accordance with the present invention.

The leading edge sections 34, 35, 36,36 may be comprised of any cross sectional configuration conventional in the art. In the preferred embodiment, as shown in FIG. 6, the cross sectional configuration of the leading edge sections 34, 35, 36,36 (which are all the same) is a curved configuration of a constant radius.

Although providing the collector leading edges with edge sections which are spaced at non-uniform distances from the exit nozzle or nozzle extender function to reduce the resonances formed in the test section, experimental results indicate that the ability of such a collector design to reduce or eliminate such resonances will depend not only on the particular angle "A" at which the side edge sections 36,36 are positioned, but also will depend on the length of the test section 18 (the distance from the nozzle exit 28 to the leading edge of the collector). Specifically, for a given air flow speed, resonances are eliminated by a collector with side edges at a certain angle "A" up to a certain test section length. As that length is increased beyond that certain length, resonances will again begin to appear. These resonances can, however, be eliminated by decreasing the angle "A" which the side edges 36,36 of the collector form with the air flow direction.

Thus, a collector design such as that shown in the drawings will reduce resonances in a test section over a collector design in which all leading edges are uniformly spaced from the nozzle exit, but only up to a certain test section length. As the angle "A" is decreased from 90° (which would define a structure in which all leading edges are uniformly spaced from the nozzle exit), resonances will be reduced or eliminated for a given air speed up to a certain length. If it is desired to increase the test section length, the angle "A" of the edge sections 36,36 is decreased.

Accordingly, by varying the angle at which the side edges 36,36 are sloped relative to the air flow direction and/or by varying the test section length by adjusting the position of the nozzle 16 and/or collector 19 or by utilizing nozzle extensions 40 such as shown in FIG. 9, the resonances for a particular application and particular air flow speed can be effectively reduced or eliminated. Thus, a method in accordance with the present invention includes providing a wind tunnel with a nozzle and a collector with at least a portion of the leading edge of the collector being non-uniformly spaced from the nozzle and varying the test section length and/or varying the angle of the leading edge sections of the collector to reduce or eliminate the resonances at a given air speed to an acceptable level.

Although the description of the preferred embodiment has been quite specific, it is contemplated that various modifications could be made without deviating from the spirit of the present invention. Accordingly, it is intended that the scope of the present invention be dictated by the appended claims rather than by the description of the preferred embodiment.

What is claimed is:

1. An open let wind tunnel comprising:
   a test section having an upstream end and a downstream end;
   an air flow path extending from said upstream end to said downstream end;
   a nozzle having a nozzle exit positioned near the upstream end of said test section; and
   a collector positioned near the downstream end of said test section, said collector including a leading edge facing said test section in which at least a portion of said leading edge is non-uniformly spaced from said nozzle exit, wherein said leading edge includes a top section and a pair of side sections extending from opposite ends of said top section and wherein at least one of said side sections slopes at an angle other than 90 degrees relative to said air flow path; and
   an air flow inlet opening, at least a portion of said air flow inlet opening being defined by said leading edge.

2. The wind tunnel of claim 1 wherein said at least one said side section slopes at an angle of between about 30 and 85 degrees.

3. The wind tunnel of claim 2 wherein said at least one said side section slopes from said top section downwardly and away from said test section.

4. The wind tunnel of claim 3 wherein each of said side sections slopes downwardly and away from said test section.

5. An open jet wind tunnel comprising:
   a test section having an upstream end and a downstream end;
   a nozzle having a nozzle exit positioned near the upstream end of said test section; and
   a collector positioned near the downstream end of said test section, said collector including a leading edge facing said test section in which at least a portion of said leading edge is non-uniformly spaced from said nozzle exit, wherein said leading edge includes a top section and a pair of side sections extending from opposite ends of said top section and wherein said at least one said side section slopes from said top section downwardly and away from said test section; and
   an air flow inlet opening, at least a portion of said air flow inlet opening being defined by said leading edge.

6. The wind tunnel of claim 5 wherein said at least one said side section slopes from said top section downwardly and away from said test section.

7. A wind tunnel comprising:
   a flow generating member generating air flow along a flow path;
   a nozzle exit defined by an exit edge;
   a collector opening defined by a leading edge;
   a test section located between said nozzle exit and said collector opening, said air flow flowing along said flow path from said nozzle exit to said collector opening; and
   said exit edge and said leading edge being configured to provide non-uniform spacing between points alone said exit edge and corresponding points along said leading edge wherein said leading edge includes a top section and a pair of side sections extending from opposite ends of said too section and wherein at least one of said side section slopes from said top section downwardly and away from said test section.

8. The wind tunnel of claim 7 wherein each of said side sections slopes downwardly and away from said test section.

9. A wind tunnel comprising:
   a test section having an upstream end and a downstream end;
   an air flow path from said upstream end to said downstream end;
   a nozzle near said upstream end; and
   a collector near said downstream end, said collector having a leading edge facing said test section, said leading edge including at least a portion which is non-uniformly spaced from a plane orthogonal to said air flow path.

10. The wind tunnel of claim 9 wherein no more than about 50 percent of said leading edge is uniformly spaced from said plane.

11. The wind tunnel of claim 10 wherein no more than about 40 percent of said leading edge is uniformly spaced from said plane.

12. The wind tunnel of claim 11 wherein no more than about 25 percent of said leading edge is uniformly spaced from said plane.

13. The wind tunnel of claim 9 wherein said leading edge includes a top section, a bottom section and a pair of side sections extending between the ends of said top section and the ends of said bottom section.

14. The wind tunnel of claim 13 wherein points along said side sections are non-uniformly spaced from said plane.

15. The wind tunnel of claim 14 wherein said side sections slope at an angle of about 30 to 60 degrees relative to said air flow path.

* * * * *

UNITED STATES PATENT AND TRADEMARK OFFICE
CERTIFICATE OF CORRECTION

PATENT NO. : 6,748,800 B2
DATED : June 15, 2004
INVENTOR(S) : John J. Lacey, Jr.

It is certified that error appears in the above-identified patent and that said Letters Patent is hereby corrected as shown below:

Column 7,
Line 59, please delete "let" and insert -- jet --.

Column 8,
Line 53, please delete "too" and insert -- top --.

Signed and Sealed this

Seventh Day of December, 2004

JON W. DUDAS
*Director of the United States Patent and Trademark Office*